(12) United States Patent
Bechtold et al.

(10) Patent No.: US 6,825,663 B2
(45) Date of Patent: Nov. 30, 2004

(54) MAGNETIC RESONANCE APPARATUS AND OPERATING METHOD THEREFOR FOR ACTIVELY REGULATING HEATING IN THE APPARATUS

(75) Inventors: Mario Bechtold, Hemhofen (DE); Ralph Kimmlingen, Nuremberg (DE); Guenter Ries, Erlangen (DE); Rudolf Roeckelein, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/374,238

(22) Filed: Feb. 25, 2003

(65) Prior Publication Data

US 2003/0164702 A1 Sep. 4, 2003

(30) Foreign Application Priority Data

Mar. 1, 2002 (DE) .......................................... 102 09 089

(51) Int. Cl.[7] .............................................. G01V 3/00
(52) U.S. Cl. ........................................ 324/318; 324/309
(58) Field of Search .................................. 324/318, 319, 324/309, 307, 321, 315; 335/300

(56) References Cited

U.S. PATENT DOCUMENTS

| | | | |
|---|---|---|---|
| 4,663,592 A | | 5/1987 | Yamaguchi et al. |
| 4,733,189 A | * | 3/1988 | Punchard et al. ............ 324/318 |
| 5,652,517 A | | 7/1997 | Maki et al. |
| 5,701,075 A | * | 12/1997 | Xu et al. ..................... 324/318 |
| 6,653,835 B2 | * | 11/2003 | Roeckelein et al. ......... 324/315 |

FOREIGN PATENT DOCUMENTS

| | | |
|---|---|---|
| DE | 100 47 584 | 9/2002 |
| EP | 1 043 598 | 10/2000 |
| WO | WO 00/16116 | 3/2000 |

* cited by examiner

Primary Examiner—Brij B. Shrivastav
(74) Attorney, Agent, or Firm—Schiff Hardin LLP

(57) ABSTRACT

In a method for the operation of a magnetic resonance apparatus having a gradient coil system as well as a shim system with a number of shim plates with respectively allocated heaters, at least one information signal indicating a change in shape and/or position of the gradient coil system is determined or employed, the regulation of the heaters, and thus the temperatures of the respective shim plates ensuing dependent thereon.

38 Claims, 2 Drawing Sheets

MAGNETIC RESONANCE APPARATUS AND OPERATING METHOD THEREFOR FOR ACTIVELY REGULATING HEATING IN THE APPARATUS

BACKGROUND OF THE INVENTION

1. Field of the Invention

The present invention is directed to a method for the operation of a magnetic resonance apparatus, as well as a magnetic resonance apparatus.

2. Description of the Prior Art

Magnetic resonance tomography is based on the physical phenomenon of nuclear magnetic resonance and has been successfully employed for many years in medicine and biophysics as an imaging method. In this examination method, the examination subject is exposed to a strong, constant magnetic field, referred to as a basic field. As a result, the nuclear spins of the atoms in the subject align, which were previously irregularly oriented. Radio-frequency waves can then excite these "ordered" nuclear spins to a specific oscillation. In tomography, this oscillation generates the actual measured signal that is picked up with suitable reception coils. In order to be able to acquire signals from the test subject spatially encoded in all three spatial directions, a gradient coil system is provided that usually has three separate gradient coils (x, y and z coils) via which separate, location-dependent magnetic fields can be generated.

The central physical phenomena in a magnetic resonance tomography apparatus are thus the magnetic fields. The magnetic fields are also responsible for the quality of the acquired images and are ultimately responsible for the diagnosis that can be produced therewith. However, there are a number of components (permanent magnets, shim plates, etc.) in a magnetic resonance tomography apparatus having temperature-dependent magnetization. The homogeneity of the basic field is disturbed if temperature fluctuations of these components occur. These parts therefore must be kept stable in temperature since compensation implemented by software of the influence of these components, which usually have a large surface area on the basic field is only possible under certain conditions and unusable image exposures may consequently occur given a field variation.

A dynamic introduction of heat ensues, for example, due to fluctuations in the room temperature or the coolant temperature, due to the time-dependent, ohmic losses in the gradient coils or as a result of eddy current losses in the components themselves. For example, in conventionally planned applications in a closed MR system, the temperature of the components can be permitted to fluctuate by no more than 0.5 K/10 minutes; but injections of power in the range from 200–300 W/m$^2$ frequently occur.

For homogenizing the basic magnetic field, it is known to employ a shim system having a number of shim plates that usually are arranged at the gradient coil system. The shim plates themselves, however, are temperature-sensitive elements, i.e. they heat up during operation. Their magnetic behavior changes due to the heating, which has a disadvantageous influence on the basic field. A positional change of the shim plates due to mechanical deformation also may occur due to the temperature-dependency of the mounting, which also may be caused by the heating of other parts that are mechanically connected to the shim plates.

It is known to keep the temperature of the shim plates constant by means of an active heating of the shim plates, so that the influence caused by temperature variation can be largely compensated.

Even though a notable improvement of the temporal and topical field homogeneity can be achieved by this measure, image sequences show that field changes in the operation of the apparatus nonetheless occur even in the case of relatively successful temperature constancy of the shim plates and the image quality deteriorates.

SUMMARY OF THE INVENTION

An object of the present invention is to provide a method that further improves the topical and temporal stability of the basic field homogeneity in the operation of a magnetic resonance apparatus, as well as a magnetic resonance apparatus wherein the topical and temporal stability of the basic field homogeneity is improved.

For solving this problem, in a method for the operation of a magnetic resonance apparatus having a gradient coil system as well as a shim system with a number of shim plates with respective heaters, at least one information signal indicating a change in shape and/or position of the gradient coil system is determined or employed, the regulation of the heaters, and thus the temperature of the shim plates, ensuing dependent thereon.

The regulation of the heaters and thus the shim plate temperature inventively ensues dependent on an information signal that is a criterion for a change in shape and/or position of the gradient coil system. It has been shown that a change in position of the shim plates occurs due to the heating of the gradient coil system that occurs during operation, the change in position leading to a deterioration of the basic field homogeneity. A field drift that has a disadvantageous influence on the acquired image sequences thus begins. By acquiring an indication of this change in shape or position taking it into account in the temperature regulation, this field drift can enter into consideration in the homogenization of the field using the shim plates, since influencing the saturation induction of the shim plates, that in turn allows a compensation of the field drift, is possible dependent on the regulated shim plate temperature. At the same time, of course, temperature stabilization of the shim plates also remains an objective of the heating procedure. It is possible to stabilize the temperature as well as to select the stabilized temperature such that geometry-caused changes of the magnetic fields can be compensated. An adequately precise temporal and topical compensation thus can ensue on the basis of the individual regulation of the individual shim plates.

In an embodiment of the invention the information signal or signals are determined using one or more measurement elements. The measurement element or elements can acquire the magnetic field or fields generated with the gradient coil system, i.e. field changes that arise in situ are directly acquired, for example markers with the MR imaging. Alternatively or additionally, the measurement element or elements can acquire the temperature of the gradient coil system, i.e. suitable temperature sensors are provided at the gradient coil system (which usually includes the coils and a carrier, usually a GFK pipe or a GFK plate into which the coils are cast), the temperature being determined over the entire system. In another alternative expansion or strain sensors that supply the information signals are employed. The strain sensors—a number thereof preferably being employed—are suitably arranged or aligned such that different types of deformations can be acquired, i.e. expansion, compression and changes in position. Of course, it is also possible to register a number of different information signals and process them in the course of the regulation.

The measurement elements preferably are arranged uniformly distributed over the gradient coil system, so that locally resolved information signals are acquired to enable an exact, temporally and topically resolved regulation.

In a further embodiment of the inventive method the measurement elements are arranged, preferably uniformly distributed at, the outside and the inside of the gradient coil system, so that topically resolved information signals from the outside and the inside can be locally acquired. The coils of the gradient coil system are arranged above one another, at least in sections, i.e. they lie at different distances from the center of the measurement subject. Signal acquisition at both sides of the gradient coil system enables a more exact registration of parameters or information signals, and thus acquisition of possible changes, since the parameters or signals are picked up as close as possible to all coils of the system. This is particularly expedient when the shim plates are likewise provided at the outside and inside, so that when, for example, the z-coil residing at the outside presents difficulties, the shim plate or plates that are adjacent to it at the outside can be suitably regulated.

An alternative to the acquisition of the information signal or signals via suitable measurement elements is to employ at least one operating parameter of the gradient coil system as the information signal. Since the changes in shape and/or position of the gradient coil system essentially arise from the operation thereof, conclusions can be made about the coil or system temperature and, from these, about possible changes in shape or position that enter into the regulation, on the basis of the relevant operating parameter or parameters. An expedient operating parameter is the operating current, i.e. the current sequence of the coils.

An operating parameter that represents a criterion for the cooling of the gradient coil system also can be employed. Despite active auxiliary heating, the gradient coil system continues to be cooled via a cooling device the operating parameters of which, of course, likewise have an influence on the temperature response of the gradient coil system. Any parameter that describes the cooling or the cooling capacity in any form can be employed as operating parameter.

In another embodiment of the inventive method, the information signal is determined by means of an analysis or one or more excitation responses received with the magnetic resonance apparatus. A field inhomogeneity is very quickly expressed within a registered image sequence, so that the field change is acquired quasi in situ by the image analysis, the quality of said field change then being identified and a corresponding information signal being output.

It is also expedient to take the energy consumption of the regulating devices for the shim into consideration in the temperature regulation. The regulating devices likewise consume energy and heat up. Their heat contribution can likewise be employed in the overall regulation.

In a further embodiment of the regulation method, a reference temperature value to which the actual temperature of the shim plates is adjusted be selected dependent on the at least one information signal. For example, a look-up table can be employed for this purpose, the suitable reference value being selected therefrom dependent on the existing information signal or signals. The reference value is forwarded to the regulating device that drives the heater.

In addition to the above-described method, the invention is directed to a magnetic resonance apparatus having a gradient coil system as well as a shim system with a number of shim plates respectively allocated heaters and a regulating device, wherein the operation of the heaters and thus the temperature of the shim plates, can be regulated dependent on at least one information signal indicating a change in shape or position of the gradient coil system.

In an embodiment of the inventive apparatus, each regulating device regulates on the basis of a reference value signal representing a criterion for a reference temperature value, the reference value signal being defined dependent on the information signal, i.e. the regulating device is provided with a reference value signal on the basis of which the regulation of the heaters ensues. Expediently, a control device that is provided with the information signal or signals, and that communicates with the regulating devices, is provided for determining the rated value signal. A look-up table can be stored in the control device, from which the reference temperature value is selected dependent on the information signal or signals and forwarded to the regulating device in the form of the reference value signal.

Because the gradient coils are respectively at different distances with reference to the examination subject, it is expedient when two regulatable heaters are allocated to each shim plate, these being arranged at opposite sides of the shim plate and being separately regulatable via the common regulating device. Since the shim plates are arranged between two gradient coils, particularly in an open system, one of these heaters is thus located relatively close to a gradient coil, so that heating as directly as possible is achieved.

One or more measurement elements that can communicate with the control device can be provided for acquiring the information signal or signals. The measurement elements can be fashioned for acquiring the magnetic fields generated with the gradient coil system, for acquiring the temperature of the gradient coil system or for acquiring expansions or compressions of the gradient coil system as may occur. Preferably, they are arranged uniformly distributed over the gradient coil system, so that locally resolved information signals can be acquired. The number of measurement elements can be arranged at the outside as well as at the inside of the gradient coil system, preferably uniformly distributed, so that locally resolved information signals can be acquired from both sides.

Alternatively or additionally, at least one operating parameter, particularly the operating current of the gradient coil system, can be employed as the information signal. An operating parameter that represents a criterion for the cooling of the gradient coil system can also be processed as information signal.

The inventive magnetic resonance apparatus also can include an analysis unit for determining the information signal by an analysis of one or more images registered with the magnetic resonance apparatus, the analysis unit communicating as warranted with the control device.

Each heater can be fashioned as a foil or film heater having a carrier foil with heat conductors applied thereon, as a plate heater having a carrier plate with heat conductors applied thereon or as a substrate heater with a ceramic, particularly Al2O3 substrate with applied heat conductors. These very flat heaters make it possible to construct the shim plates relatively small despite the integrated heater. The heat conductors themselves are expediently arranged to proceed in bifilar fashion for suppressing magnetic fields that may be generated during their operation, i.e. there are respective forward and return lines, so that magnetic fields caused by a flow of current mutually compensate.

DESCRIPTION OF THE PREFERRED EMBODIMENTS

Figure 1:
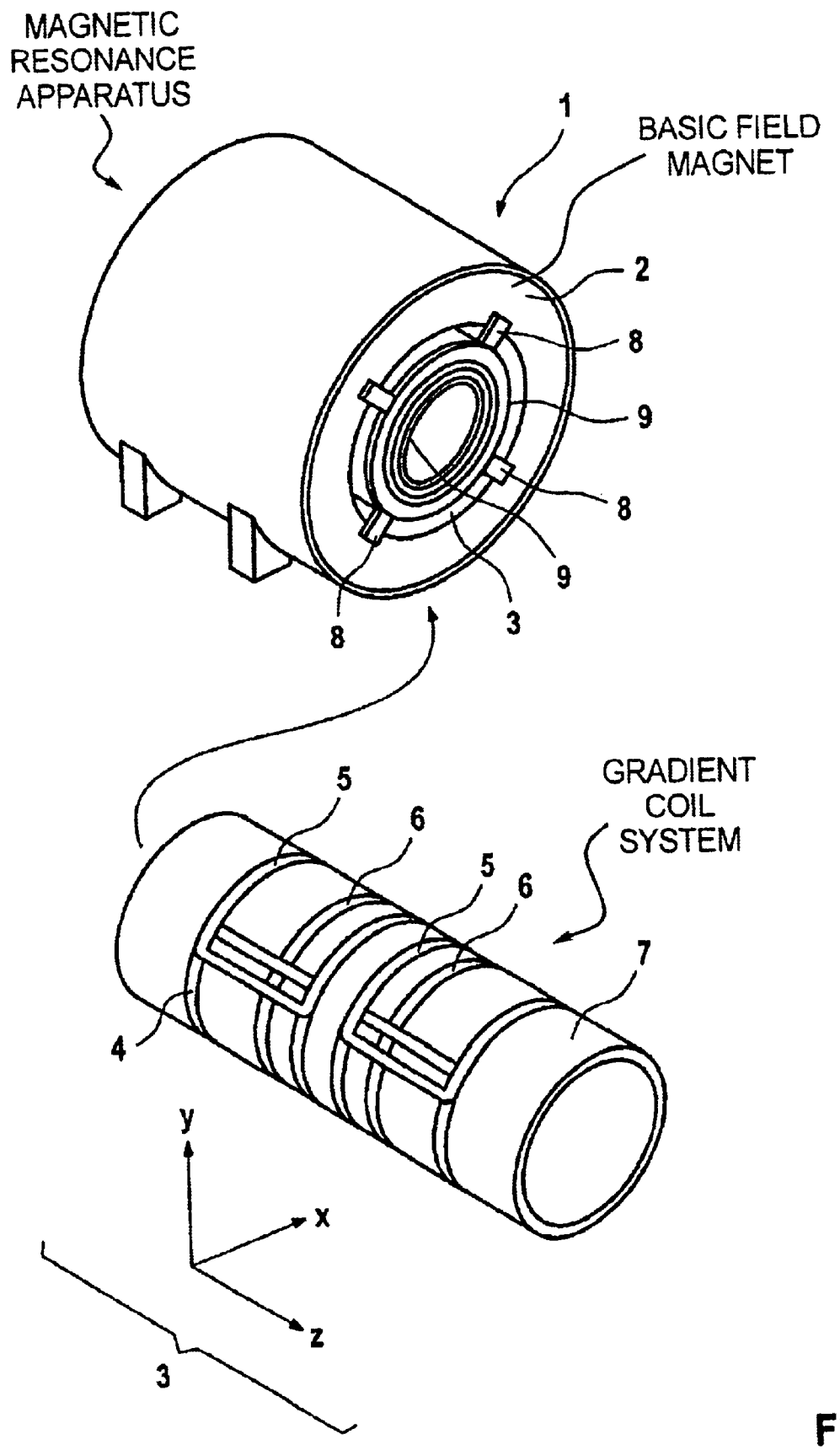
FIG. 1 is a schematic illustration of the relevant field-generating components of a magnetic resonance apparatus.

FIG. 1 illustrates an inventive magnetic resonance apparatus 1, with only the relevant field-generating elements being shown. A basic field magnet 2 (for example, an axial superconducting air coil magnet with active stray field shielding) is shown that generates a uniform magnetic basic field in an interior volume. The interior of the superconducting basic field magnet 2 is composed of superconducting coils that are situated in liquid helium. The basic field magnet 1 is surrounded by a two-shell (double-walled) jacket that is usually composed of stainless steel. The inner shell, which contains the liquid helium and partly serves as winding body for the magnetic coils, is suspended at the outer shell, which is at room temperature, via weakly thermally conductive GFK rods. A vacuum prevails between the inner and outer shell. The cylindrical gradient coil system 3 is concentrically introduced into the inside of the basic field magnet 2 into the inside of a carrying tube, by means of carrying elements 8. The carrying tube is limited toward the outside and toward the inside by means of two inner shells 9.

The gradient coil system 3 has three sub-windings that respectively generate gradient fields that are spatially perpendicular to one another, each field being proportional to the current in the coil that generates it. As shown in FIG. 1, the gradient coil system 3 has an x-coil 4, a y-coil 5 and a z-coil 6 that are respectively wound around a coil carrier 7 (for example, a GFK tube) and thus gradient fields are respectively generated in the direction of the Cartesian axes x, y, z. Each of these coils is equipped with its own power supply in order to generate current pulses with exact amplitude and at the exact time required by the sequence programmed in the pulse sequence controller. The required currents lie between about 250-450A. Since the gradient switching times should be as short as possible, current rise rates on the order of magnitude of 250 kA/s are required.

Figure 2:
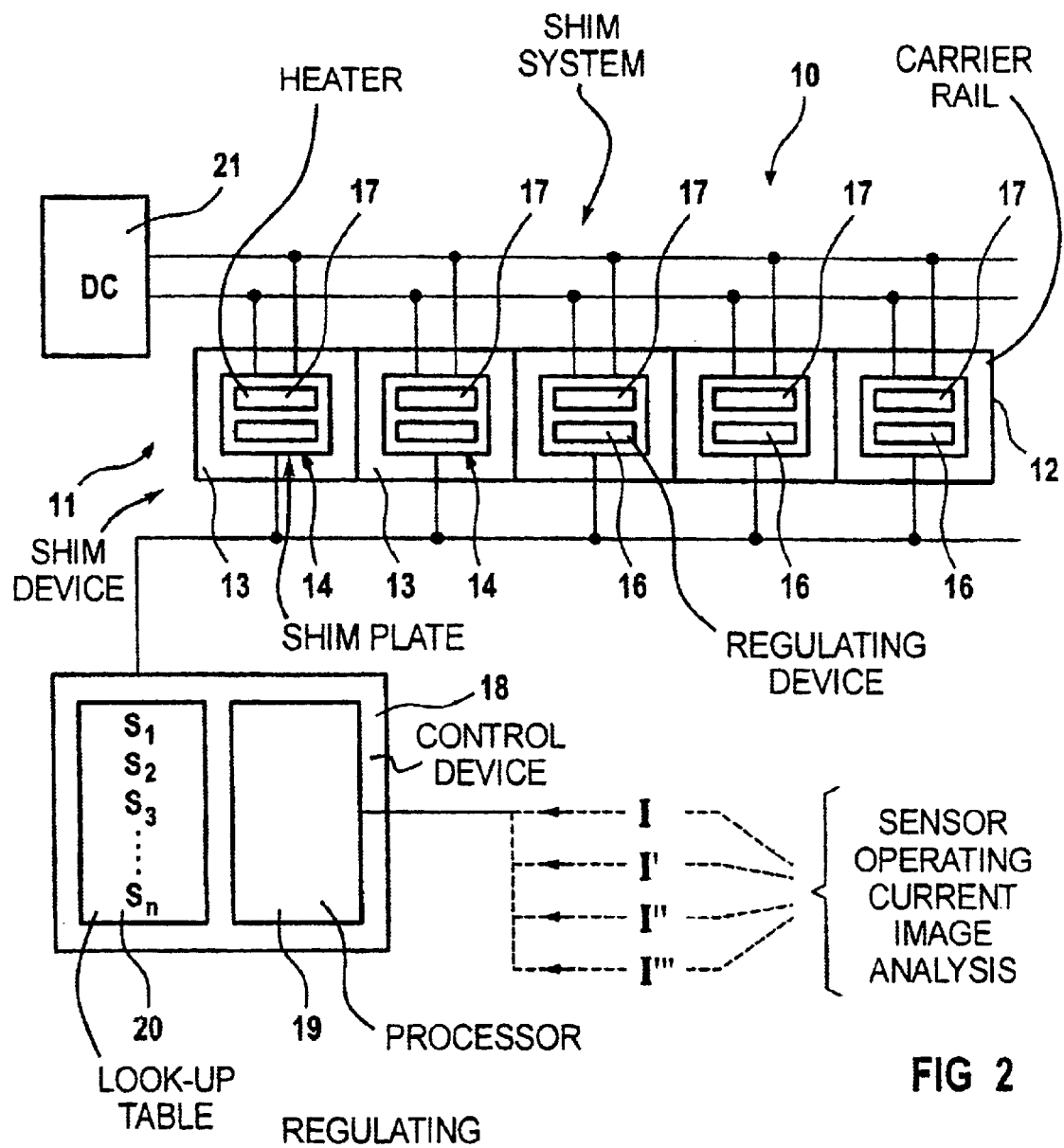
FIG. 2 is a schematic illustration of the temperature regulation of the shim plates in accordance with the invention.
Figure 3:
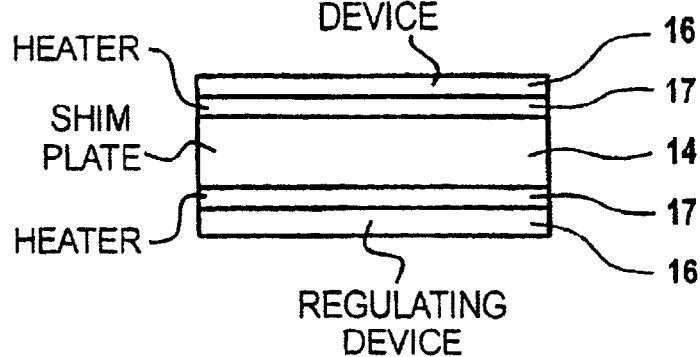
FIG. 3 is a sectional view of a shim plate in accordance with the invention.

Since the gradient coil system 3 usually is surrounded by conductive structures (for example, magnet vessel of stainless steel), eddy currents are generated therein due to the pulsed (charging) fields, the eddy currents in turn entering into interaction with the basic magnetic field and modifying it. The homogeneity of the basic field in the measurement volume is of fundamental significance in magnetic resonance tomography. A shim system 10 (a portion thereof is shown in FIG. 2) is provided in order to homogenize this field. This shim system 10 includes a number of shim devices 11 (one thereof is shown in FIG. 2) arranged concentrically around the gradient coil. Each shim device 11 has a thermally and electrically non-conductive carrier rail 12, primarily an injection molded part of, for example, GFK material, in which a number of chamber-like receptacles 13 are formed, wherein respective shim elements 14 are arranged. Each shim plate (one thereof is shown magnified in FIG. 3) is composed of the actual shim plate 14. In the example according to FIG. 3, a regulating device 16 and a heater 17, regulated via the former, are provided at each side of the shim plate 14. A non-magnetic, thermally conductive plate (which is not shown in detail in FIG. 3) can be provided between the shim plate 14 and the heater 17. The heater 17 can be, for example, a foil heater, a plate heater or a substrate heater with heat conductors applied (for example, in serpentine form) on the foil, the plate or the substrate. A temperature sensor (not shown in detail) that directly or indirectly (via the intervening plate) acquires the temperature of the shim plate 14 is situated at the same side as the coil. The temperature sensor is connected to the regulating device 16 that regulates the operation of the heater 17 in order to thus set the temperature of the shim plate 14 to a prescribed reference value temperature, as discussed below.

Since each shim plate 14 has a separate heater 17, it is thus possible to separately manage the temperature of each shim plate 14. In this way, a constant temperature of the shim plates can be maintained, this being required for the homogenization of the basic field. Moreover, the individual control possibility also allows a reaction to changes in shape and/or position of the gradient coils or of the gradient coil system 3 including the coils 4, 5 and 6 as well as the coil carrier 7. During operation, the gradient coils 4, 5 and 6 are subjected to high currents that lead to significant heating and can definitely lead to a change in shape and position. This has disadvantageous effects on the homogeneity of the basic magnetic field.

In order to counteract this, as shown in FIG. 2, information signals I, I', I" and I''' are determined in various possible ways, these supplying information about whether a change in shape and/or position of the gradient coil system occurs. These information signals—only one thereof may already be sufficient—are acquired, for example, via sensors that are preferably arranged uniformly distributed at the gradient coil system 3, on the coil carrier 7. For example, temperature sensors, magnetic field sensors (that detect the magnetic fields generated by the gradient coils 4, 5 and 6) or expansion (strain) sensors can be employed as these sensors. An information signal in the form of an operating parameter of the gradient can likewise be employed. For example, the operating currents of the coils 4, 5 and 6 can be used; i.e., the current or pulse sequence of the coils 4, 5 and 6 is taken into consideration. Alternatively or additionally, it is possible to analyze changes in shape and/or position (which are expressed in image modifications) in the framework of an image analysis of the images registered with the magnetic resonance apparatus 1. Suitable analysis algorithms are employed therefor.

The information signal or signals I, . . . , I''' are forwarded to a control device 19 that has a processor 19 that processes the information signal or signals. Dependent on the quality of the information signals, the processor 19 selects a reference temperature value $S_1, S_2 \ldots S_n$ from a look-up table 20 that serves for maintaining a constant temperature and simultaneously serves for the compensation of a field drift resulting from a change in shape and/or position of the gradient coil system 3. This selected reference temperature value is forwarded to each regulating device 16 one of which being shown in FIG. 2 as an example. In the regulating device 16, the given reference temperature value is then compared to the actual temperature value measured via the temperature sensor at the shim plate 14 and a corresponding regulation of the operation of the heater 17 (only one thereof per shim plate 14 is likewise shown in FIG. 2) is made. The heaters 17 are connected to a suitable current source 21 via which the power is delivered for heating purposes.

The regulation of the heaters 17 and thus the setting of the temperature of the shim plates 14 ensues dependent on at least one information signal that indicates a change in shape and/or position of the gradient coil system 3 in order to be able to compensate inhomogeneities of the basic magnetic field that result therefrom. At the same time, a direct heating of the shim plates 14 adequately maintains a constant temperature, insofar as this is required.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance apparatus comprising the steps of:
    operating a basic field magnet of a magnetic apparatus for generating a basic magnetic field;
    operating a gradient coil system of said magnetic resonance apparatus for generating at least one gradient field, said gradient coil system being subject to a change in at least one of shape and position during operation thereof;
    shimming said basic magnetic field with a plurality of ferromagnetic shim plates, disposed at said coil system, with a shimming effect for homogenizing said basic magnetic field, said change causing a change in said shimming effect;
    providing a plurality of heaters respectively in thermally conductive relation with said plurality of shim plates;
    obtaining an information signal during operation of said gradient coil system indicative of said change in at least one of shape and position of the gradient coil system; and
    regulating said heaters during operation of said gradient coil system dependent on said information signal for compensating said change in said shimming effect for substantially restoring said shimming effect for homogenizing said basic magnetic field.

2. A method as claimed in claim 1 comprising measuring said change with at least one measurement element, and obtaining said information signal from said measurement element.

3. A method as claimed in claim 2 comprising measuring at least one magnetic field, with said measurement element, generated by said gradient coil system during operation of said gradient coil system.

4. A method as claimed in claim 2 comprising measuring a temperature of said gradient coil system with said measurement element during operation of said gradient coil system.

5. A method as claimed in claim 2 comprising measuring an expansion of said gradient coil system with said measurement element during operation of said gradient coil system.

6. A method as claimed in claim 2 comprising employing a plurality of measurement sensors distributed over said gradient coil system for respectively obtaining a plurality of locally resolved information signals.

7. A method as claimed in claim 6 comprising uniformly distributing said measurement elements over said gradient coil system.

8. A method as claimed in claim 6 comprising distributing said plurality of measurement elements over an interior and an exterior of said gradient coil system.

9. A method as claimed in claim 1 comprising operating said gradient coil system with at least one operating parameter, and using said operating parameter as said information signal.

10. A method as claimed in claim 8 comprising operating said gradient coil system with an operating current, as said operating parameter, and using a value characterizing said operating current as said information signal.

11. A method as claimed in claim 10 comprising obtaining a further information signal representing a criterion for cooling said gradient coil system during operation of said gradient coil system, and regulating said heaters during operation of said gradient coil system dependent on said information signal characterizing said operating current and said further information signal.

12. A method as claimed in claim 1 comprising, as a result of operating said gradient coil system obtaining an excitation response of a subject exposed to said gradient field, and obtaining said information signal by analyzing said excitation response.

13. A method as claimed in claim 1 wherein regulation of said heaters has an energy consumption associated therewith, and comprising regulating said heaters dependent on said information signal and said energy consumption.

14. A method as claimed in claim 1 wherein the step of regulating said heaters dependent on said information signal comprises setting a reference temperature respectively for said shim plate dependent on said information signal, and operating said heaters to cause an actual temperature of the respective shim plates to match said reference temperature.

15. A method as claimed in claim 14 comprising selecting said reference temperature from a stored look-up table.

16. A magnetic resonance apparatus comprising:
    a basic field magnet operable to generate a basic magnetic field;
    a gradient coil system operable to generate at least one gradient field, said gradient coil system being subject to a change in at least one of shape and position during operation thereof;
    a plurality of ferromagnetic shim plates disposed at said gradient coil system, operable to produce a shimming effect for homogenizing said basic magnetic field, said chance causing a chance in said shimming effect;
    a plurality of heaters respectively in thermally conductive relation with said plurality of shim plates; and
    a plurality of regulators respectively allocated to said plurality of heaters, each of said regulators regulating the heater allocated thereto dependent on an information signal indicative of said change in said at least one of shape and position of said gradient coil system, for compensating said chance in said shimming effect for substantially restoring said shimming effect for homogenizing said basic magnetic field.

17. A magnetic resonance apparatus as claimed in claim 16 comprising a control device connected to said regulators and being supplied with said information signal, said control device generating a reference value signal, representing a criterion for a reference temperature value, dependent on said information signal, and said control unit supplying said reference value signal to each of said regulators and each of said regulators regulating the heater allocated thereto dependent on said reference value signal.

18. A magnetic resonance apparatus as claimed in claim 17 wherein said control device contains a look-up table wherein a plurality of reference temperature values are stored respectively allocated to different values of said information signal, and wherein said control unit selects the reference temperature value from said look-up table allocated to the information signal supplied to said control unit.

19. A magnetic resonance apparatus as claimed in claim 16 wherein each of said heaters comprises first and second heater elements respectively disposed on opposite sides of the shim plate in thermally conductive relation therewith, and wherein each of said regulators regulates the first and second heater elements of the heater allocated thereto in common.

20. A magnetic resonance apparatus as claimed in claim 16 wherein each of said heaters comprises a first heater element and a second heater element respectively disposed on opposite sides of the shim plate in thermally conductive relation therewith, and wherein each of said regulators comprises a first element regulator for regulating the first heater element of the heater allocated thereto and a second element regulator for regulating the second heater element of the heater allocated thereto.

21. A magnetic resonance apparatus as claimed in claim 16 comprising a measurement element for obtaining said information signal.

22. A magnetic resonance apparatus as claimed in claim 21 wherein said measurement element is a magnetometer that measures said at least one gradient magnetic field.

23. A magnetic resonance apparatus as claimed in claim 21 wherein said measurement element is a temperature sensor which measures a temperature of said gradient coil system.

24. A magnetic resonance apparatus as claimed in claim 21 wherein said measurement element is a strain sensor which measures expansion and contraction of said gradient coil system.

25. A magnetic resonance apparatus as claimed in claim 16 comprising a plurality of measurement elements distributed over said gradient coil system for respectively obtaining locally resolved information signals.

26. A magnetic resonance apparatus as claimed in claim 25 wherein said plurality of measurement elements is uniformly distributed over said gradient coil system.

27. A magnetic resonance apparatus as claimed in claim 25 wherein said plurality of measurement elements is distributed at an interior and an exterior of said gradient coil system.

28. A magnetic resonance apparatus as claimed in claim 16 wherein said gradient coil system is operated according to at least one operating parameter, and wherein said regulators regulate said heaters dependent on said at least one operating parameter, as said information signal.

29. A magnetic resonance apparatus as claimed in claim 28 wherein said gradient coil system is supplied with operating current, and wherein said regulators regulate said heaters dependent on said operating current.

30. A magnetic resonance apparatus as claimed in claim 29 wherein a further operating parameter of said gradient coil system is a criterion for cooling said gradient coil system, and wherein said regulators regulate said heaters additionally dependent on said further operating parameter.

31. A magnetic resonance apparatus as claimed in claim 16 comprising a scanner, which includes said gradient coil system, for obtaining an image of a subject exposed to said at least one gradient field, and further comprising an image analysis unit for analyzing said image and for generating said information signal dependent on said analysis of said image.

32. A magnetic resonance apparatus as claimed in claim 16 wherein said regulators respectively consume energy, and regulate said heaters additionally dependent on said energy.

33. A magnetic resonance apparatus as claimed in claim 16 wherein said plurality of heaters is respectively in said thermally conductive relation with said plurality of shim plates by direct attachment to the respective shim plates.

34. A magnetic resonance apparatus as claimed in claim 33 wherein each of said heaters comprises a foil heater having a carrier foil with electrical heat-generating conductors applied thereto.

35. A magnetic resonance apparatus as claimed in claim 33 wherein each of said heaters is a plate heater having a carrier plate with electrical heat-generating conductors applied thereto.

36. A magnetic resonance apparatus as claimed in claim 33 wherein each of said heaters is a substrate heater having a ceramic substrate with electrical heat-generating conductors applied thereto.

37. A magnetic resonance apparatus as claimed in claim 36 wherein said ceramic substrate is an $Al_2O_3$ substrate.

38. A magnetic resonance apparatus as claimed in claim 33 wherein each of said heaters has electrical heat-generating conductors proceeding in bifilar fashion for suppressing magnetic fields generated by said conductors.

* * * * *